(12) United States Patent
Kirita et al.

(10) Patent No.: US 8,182,722 B2
(45) Date of Patent: May 22, 2012

(54) METHODS FOR MANUFACTURING ZINC OXIDE BASE SPUTTERING TARGET AND TRANSPARENT ELECTRICALLY CONDUCTIVE FILM

(75) Inventors: Shina Kirita, Tokyo (JP); Toshitaka Kawashima, Kanagawa (JP); Takahiro Nagata, Kanagawa (JP); Yuichi Kamori, Miyagi (JP)

(73) Assignee: Sony Corporation, Tokyo (JP)

( * ) Notice: Subject to any disclaimer, the term of this patent is extended or adjusted under 35 U.S.C. 154(b) by 126 days.

(21) Appl. No.: 12/621,176

(22) Filed: Nov. 18, 2009

(65) Prior Publication Data
US 2010/0123103 A1 May 20, 2010

(30) Foreign Application Priority Data

Nov. 20, 2008 (JP) ................. 2008-296414

(51) Int. Cl.
*H01B 1/08* (2006.01)
*B05D 5/12* (2006.01)

(52) U.S. Cl. .......... 252/519.51; 204/192.15; 204/192.29
(58) Field of Classification Search ............. 252/519.51; 204/192.15, 192.29
See application file for complete search history.

(56) References Cited

U.S. PATENT DOCUMENTS

| 4,319,215 | A | * | 3/1982 | Yamazaki et al. | 338/21 |
| 5,236,632 | A | * | 8/1993 | Ogawa et al. | 252/519.5 |
| 6,146,552 | A | * | 11/2000 | Iga et al. | 252/519.5 |
| 2010/0006837 | A1 | * | 1/2010 | Cho et al. | 257/43 |

FOREIGN PATENT DOCUMENTS

| JP | 07-258836 | 10/1995 |
| JP | 2006-200016 | 8/2006 |

* cited by examiner

*Primary Examiner* — Mark Kopec
(74) *Attorney, Agent, or Firm* — SNR Denton US LLP

(57) ABSTRACT

A method for manufacturing a zinc oxide based sputtering target includes the step of producing a zinc oxide based sputtering target by using $\gamma$-$Al_2O_3$ as a dopant material.

17 Claims, 3 Drawing Sheets

METHODS FOR MANUFACTURING ZINC OXIDE BASE SPUTTERING TARGET AND TRANSPARENT ELECTRICALLY CONDUCTIVE FILM

CROSS REFERENCE TO RELATED APPLICATIONS

This application is based upon and claims the benefit of priority from the prior Japanese Patent Application JP 2008-296414, filed in the Japan Patent Office on Nov. 20, 2008, the disclosure of which is hereby incorporated by reference in its entirety.

BACKGROUND OF THE INVENTION

1. Field of the Invention

The present invention relates to a zinc oxide based sputtering target favorably applied to film formation of a zinc oxide based transparent electrically conductive film, a method for manufacturing the zinc oxide based sputtering target, a zinc oxide based transparent electrically conductive film, a method for manufacturing the zinc oxide based transparent electrically conductive film, and an electronic apparatus including the zinc oxide based transparent electrically conductive film.

2. Description of the Related Art

As for transparent electrically conductive films for electronic apparatuses, e.g., liquid crystal displays, organic EL displays, and touch panels, indium tin oxide (ITO) has been previously widely used, in which indium oxide ($In_2O_3$) has been doped with tin oxide ($SnO_2$). However, development of a material alternative to ITO has become urgent because of a jump in ITO prices along with exhaustion of ITO in recent years. Among the materials alternative to ITO, zinc oxide (ZnO) based transparent electrically conductive materials have been noted because of rich resources and low costs, so that research has been conducted actively.

As for a method for forming the zinc oxide based transparent electrically conductive film, various methods, e.g., a sputtering method, a pulse laser deposition (PLD) method, an ion plating method, and a vacuum evaporation method, are in the public domain. Among them, the sputtering method has been adopted predominantly on the grounds that high speed film formation can be conducted, and so on.

In the past, as for a sputtering target to form the zinc oxide based transparent electrically conductive film exhibiting low resistance and excellent transparency by the sputtering method, an AZO target, in which zinc oxide (ZnO) is doped with 2 percent by weight of aluminum oxide ($Al_2O_3$), has been used (refer to, for example, Japanese Unexamined Patent Application Publication No. 7-258836 and Japanese Unexamined Patent Application Publication No. 2006-200016).

SUMMARY OF THE INVENTION

In general, in order to conduct stable film formation by the sputtering method, it is desirable to use a sputtering target capable of performing stable discharge. Consequently, it is desirable to increase the density of the sputtering target and reduce the resistivity. However, the AZO target proposed in Japanese Unexamined Patent Application Publication Nos. 7-258836 and 2006-200016 has problems in that the density of the target produced is low and the resistivity is high.

Accordingly, it is desirable to provide a zinc oxide based sputtering target having a sufficiently high density and a sufficiently low resistivity and a method for manufacturing the same.

It is also desirable to provide a good-quality zinc oxide based transparent electrically conductive film exhibiting low resistance and excellent transparency, a method for manufacturing the same, and an electronic apparatus including the zinc oxide based transparent electrically conductive film.

The present inventors have recognized the above-described problems and have conducted intensive research. As a result, the present invention has been made. The outline thereof is as described below.

Regarding the AZO target proposed in Japanese Unexamined Patent Application Publication Nos. 7-258836 and 2006-200016, zinc oxide is doped with $Al_2O_3$, which is $\alpha$-$Al_2O_3$ having an $\alpha$-type crystal structure. In the method for manufacturing the AZO target, previously, the crystal structure of $Al_2O_3$, with which zinc oxide is doped, has not been noted. However, the present inventors found that the density and the resistivity of the resulting AZO target were changed significantly depending on the crystal structure of $Al_2O_3$, with which zinc oxide was doped. Specifically, the crystal structures of aluminum oxide include a $\beta$ type and a $\gamma$ type besides the above-described $\alpha$ type, and it was found that in the case where $\gamma$-$Al_2O_3$ having a $\gamma$-type crystal structure was used as a dopant material, the density of the target was able to become a maximum, and the resistivity was able to become a minimum. Here, it is in the public domain that $\gamma$-$Al_2O_3$ has a cubic crystal structure and is converted to $\alpha$-$Al_2O_3$ when being heated to 1,000° C. or higher.

The present inventors conducted further research on the basis of the above-described findings obtained originally and, as a result, the present invention has been made.

A method for manufacturing a zinc oxide based sputtering target according to an embodiment of the present invention includes the step of producing a zinc oxide based sputtering target by using $\gamma$-$Al_2O_3$ as a dopant material.

In a zinc oxide based sputtering target according to an embodiment of the present invention, $\gamma$-$Al_2O_3$ is used as a dopant material.

A method for manufacturing a zinc oxide based transparent electrically conductive film according to an embodiment of the present invention includes the step of forming a zinc oxide based transparent electrically conductive film by a sputtering method through the use of a zinc oxide based sputtering target in which $\gamma$-$Al_2O_3$ is used as a dopant material.

A zinc oxide based transparent electrically conductive film according to an embodiment of the present invention is formed by a sputtering method through the use of a zinc oxide based sputtering target in which $\gamma$-$Al_2O_3$ is used as a dopant material.

An electronic apparatus according to an embodiment of the present invention includes a zinc oxide based transparent electrically conductive film formed by a sputtering method through the use of a zinc oxide based sputtering target in which $\gamma$-$Al_2O_3$ is used as a dopant material.

The electronic apparatus may be of various types insofar as the transparent electrically conductive film is used. Specific examples include liquid crystal displays, organic EL displays, and touch panels. The use of the transparent electrically conductive film does not much matter.

Regarding each of the above-described cases, the content of $\gamma$-$Al_2O_3$ of the zinc oxide based sputtering target is selected as necessary. However, it is preferable that the content is selected within the range of 1 percent by weight or more, and 3 percent by weight or less, and most preferably about 2 percent by weight is selected from the viewpoint of obtainment of a low resistivity. The zinc oxide based sputtering target is produced typically by mixing and sintering a zinc oxide powder and a γ-$Al_2O_3$ powder. The sintering temperature is selected as necessary. However, 1,150° C. or higher, and 1,300° C. or lower is preferable. It is preferable that the γ-$Al_2O_3$ powder has a smaller particle size from the viewpoint of an increase in density and a reduction in resistivity of the zinc oxide based sputtering target. Specifically, the γ-$Al_2O_3$ powder having a particle size of 0.5 μm or less is used. In this case, the particle size of the γ-$Al_2O_3$ powder is typically 0.3 μm or more although not limited to this.

Regarding the cases related to the zinc oxide based transparent electrically conductive film and the electronic apparatus, after the zinc oxide based transparent electrically conductive film is formed by the sputtering method, the zinc oxide based transparent electrically conductive film is stabilized by conducting a heat treatment (or firing) at a temperature of 120° C. or higher, as necessary. Consequently, for example, variation of the resistivity of the zinc oxide based transparent electrically conductive film with time can be prevented.

Regarding the present invention having the above-described configuration, the density can be increased sufficiently and the resistivity can be reduced sufficiently by using γ-$Al_2O_3$ as a dopant material of the zinc oxide based sputtering target as compared with those in the case where α-$Al_2O_3$ is used as the dopant material.

According to an embodiment of the present invention, a zinc oxide based sputtering target having a sufficiently high density and a sufficiently low resistivity can be obtained. Furthermore, a good-quality zinc oxide based transparent electrically conductive film exhibiting low resistance and excellent transparency can be produced with high productivity at a low cost by forming the zinc oxide based transparent electrically conductive film by a sputtering method in which this zinc oxide based sputtering target is used.

DESCRIPTION OF THE PREFERRED EMBODIMENTS

Figure 1:
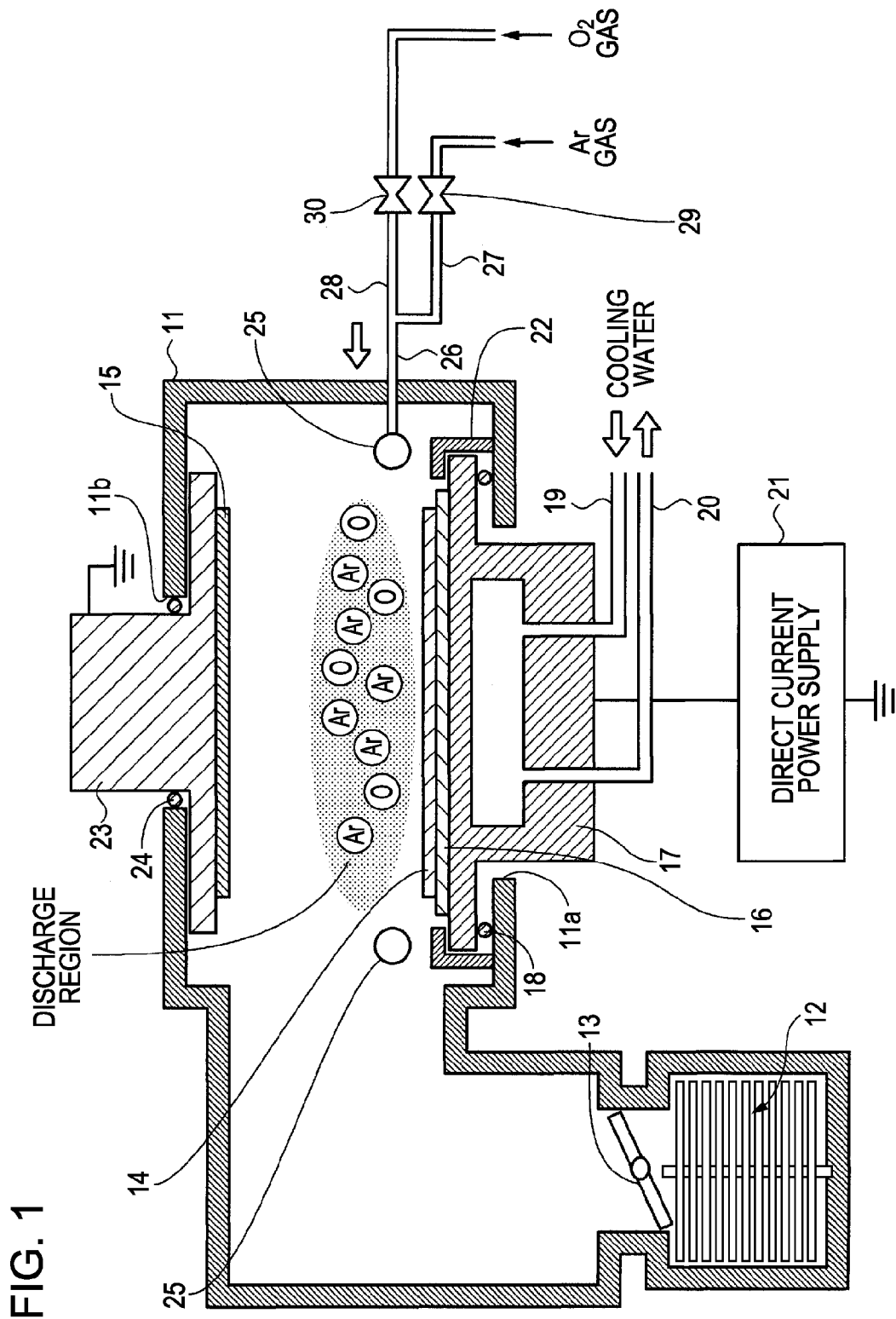
FIG. 1 is a schematic diagram showing a dc magnetron sputtering apparatus used for forming a zinc oxide based transparent electrically conductive film in Example 1.

The preferred embodiments for carrying out the invention (hereafter referred to as embodiments) will be described below. The explanation will be made in the following order.
1. First embodiment (zinc oxide based sputtering target and method for manufacturing the same)
2. Second embodiment (zinc oxide based sputtering target and method for manufacturing the same)
3. Third embodiment (method for manufacturing zinc oxide based transparent electrically conductive film)

1. First Embodiment

Zinc oxide based sputtering target and method for manufacturing the same

In the first embodiment, initially, a ZnO powder and a γ-$Al_2O_3$ powder having a standard particle size (2.2 μl) as a dopant are mixed. At this time, the resulting mixed powder is allowed to contain 1 to 3 percent by weight of γ-$Al_2O_3$ powder.

Next, the mixed powder is filled into a mold in a hot press machine, and the mixed powder is pressure-molded in an inert gas atmosphere and is sintered.

In this manner, a zinc oxide based sputtering target is produced, in which γ-$Al_2O_3$ is used as a dopant material.

Table 1 shows the densities and the resistivities of the thus produced zinc oxide based sputtering targets. In Table 1, the density and the resistivity of a zinc oxide based sputtering target produced by the same method except that α-$Al_2O_3$ instead of γ-$Al_2O_3$ was used as the dopant material are also shown for the purpose of comparison. In this regard, the content of α-$Al_2O_3$ or γ-$Al_2O_3$ was specified to be 2 percent by weight in all cases, and the sintering temperature was specified to be 1,150° C. in the case where α-$Al_2O_3$ was used and 1,150° C. or 1,300° C. in the case where γ-$Al_2O_3$ was used.

TABLE 1

| Dopant material | $Al_2O_3$ content (percent by weight) | Sintering temperature (° C.) | Density (g/cm$^3$) | Resistivity (Ω · cm) |
|---|---|---|---|---|
| α-$Al_2O_3$ | 2 | 1150 | 4.58 | $4.13 \times 10^{-4}$ |
| γ-$Al_2O_3$ | 2 | 1150 | 4.91 | $3.55 \times 10^{-4}$ |
| γ-$Al_2O_3$ | 2 | 1300 | 5.35 | $1.22 \times 10^{-4}$ |

As is clear from Table 1, the density of the zinc oxide based sputtering target produced by using α-$Al_2O_3$ as the dopant material is 4.58 g/cm$^3$. On the other hand, the density of the zinc oxide based sputtering target produced at the same sintering temperature by using γ-$Al_2O_3$ as the dopant material is 4.91 g/cm$^3$ and, therefore, is higher by about 7%. Furthermore, the resistivity of the zinc oxide based sputtering target produced by using α-$Al_2O_3$ as the dopant material is $4.13 \times 10^{-4}$ Ω·cm. On the other hand, the resistivity of the zinc oxide based sputtering target produced by using γ-$Al_2O_3$ as the dopant material is $3.55 \times 10^{-4}$ Ω·cm and, therefore, is lower by about 14%.

Moreover, as is clear from Table 1, in the case where γ-$Al_2O_3$ was used as the dopant material, regarding the zinc oxide based sputtering target produced at a sintering temperature of 1,300° C., the density is higher and the resistivity is lower than those of the zinc oxide based sputtering target produced at a sintering temperature of 1,150° C. If the sintering temperature exceeds 1,300° C., decomposition and vaporization of zinc oxide become active and, thereby, weight reduction of a sintered material occurs, so that there is an increasing tendency of the productivity to reduce. Therefore, it is preferable that the sintering temperature does not exceed 1,300° C. Consequently, it is preferable that the sintering temperature is 1,150° C. to 1,300° C.

As described above, according to the first embodiment, the zinc oxide based sputtering target is produced by using γ-$Al_2O_3$ as the dopant material. Regarding the thus produced zinc oxide based sputtering target, the density can be increased sufficiently and the resistivity can be reduced sufficiently, so that good target characteristics can be obtained as compared with those in the case where the zinc oxide based sputtering target is produced by using $\alpha$-$Al_2O_3$ as the dopant material. Consequently, stable discharge can be performed when film formation is conducted through the use of this zinc oxide based sputtering target in a sputtering apparatus. Therefore, the zinc oxide based transparent electrically conductive film can be formed stably.

2. Second Embodiment

Zinc Oxide Based Sputtering Target and Method for Manufacturing the Same

In the second embodiment, initially, a $\gamma$-$Al_2O_3$ powder having a standard particle size (2.2 μm) is pulverized with zirconia ($ZrO_2$) beads to make the particle size 0.5 μm or less.

Subsequently, a ZnO powder and the $\gamma$-$Al_2O_3$ powder having a particle diameter specified to be 0.5 μm or less are mixed. At this time, the resulting mixed powder is allowed to contain 1 to 3 percent by weight of $\gamma$-$Al_2O_3$ powder.

Next, the mixed powder is filled into a mold in a hot press machine, and the mixed powder is pressure-molded in an inert gas atmosphere and is sintered.

In this manner, a zinc oxide based sputtering target is produced, in which $\gamma$-$Al_2O_3$ having a particle size of 0.5 μm or less is used as a dopant material.

Table 2 shows the densities and the resistivities of the thus produced zinc oxide based sputtering targets. In Table 2, the densities and the resistivities of a zinc oxide based sputtering target produced by the same method as that described above except that $\gamma$-$Al_2O_3$ having the standard particle size (2.2 μm) instead of $\gamma$-$Al_2O_3$ having a particle size of 0.5 μm or less was used and a zinc oxide based sputtering target produced by the same method as that described above except that $\alpha$-$Al_2O_3$ having the standard particle size (2.2 μm) instead of $\gamma$-$Al_2O_3$ having a particle size of 0.5 μm or less was used are also shown for the purpose of comparison. In this regard, the content of $\alpha$-$Al_2O_3$ or $\gamma$-$Al_2O_3$ was specified to be 2 percent by weight and the sintering temperature was specified to be 1,150° C. in all cases.

TABLE 2

| Dopant material | $Al_2O_3$ content (percent by weight) | Sintering temperature (° C.) | Density (g/cm³) | Resistivity (Ω · cm) | Particle size (μm) |
|---|---|---|---|---|---|
| $\alpha$-$Al_2O_3$ | 2 | 1150 | 4.58 | $4.13 \times 10^{-4}$ | 2.2 |
| $\gamma$-$Al_2O_3$ | 2 | 1150 | 4.91 | $3.55 \times 10^{-4}$ | 2.2 |
| $\gamma$-$Al_2O_3$ (fine powder) | 2 | 1150 | 5.5 | $1.21 \times 10^{-4}$ | 0.5 or less |

As is clear from Table 2, the density of the zinc oxide based sputtering target produced by using $\gamma$-$Al_2O_3$ having the standard particle size (2.2 μm) as the dopant material is a high 4.91 g/cm³. On the other hand, the density of the zinc oxide based sputtering target produced by using $\gamma$-$Al_2O_3$ having a particle size of 0.5 μm or less as the dopant material is a further high 5.5 g/cm³.

Moreover, the resistivity of the zinc oxide based sputtering target produced by using $\gamma$-$Al_2O_3$ having the standard particle size (2.2 μm) as the dopant material is a low $3.55 \times 10^{-4}$ Ω·cm. On the other hand, the resistivity of the zinc oxide based sputtering target produced by using $\gamma$-$Al_2O_3$ having a particle size of 0.5 μm or less as the dopant material is a further low $1.21 \times 10^{-4}$ Ω·cm.

As described above, according to the second embodiment, the zinc oxide based sputtering target is produced by using $\gamma$-$Al_2O_3$ having a particle size of 0.5 μm or less as the dopant material. Regarding the thus produced zinc oxide based sputtering target, the density can be further increased and the resistivity can be further reduced, so that good target characteristics can be obtained as compared with those in the case where the zinc oxide based sputtering target is produced by using $\alpha$-$Al_2O_3$ as the dopant material in the related art. Consequently, stable discharge can be performed when film formation is conducted through the use of this zinc oxide based sputtering target in a sputtering apparatus, so that the zinc oxide based transparent electrically conductive film can be formed stably. In addition, as described later, the amount of occurrence of abnormal discharge in film formation of the zinc oxide based transparent electrically conductive film can be reduced significantly. Therefore, the zinc oxide based transparent electrically conductive film can be formed further stably.

3. Third Embodiment

Method for Manufacturing Zinc Oxide Based Transparent Electrically Conductive Film In the third embodiment, a zinc oxide based transparent electrically conductive film is formed on a substrate by the sputtering method through the use of the zinc oxide based sputtering target produced in the second embodiment in which $\gamma$-$Al_2O_3$ having a particle size of 0.5 μm or less is used as the dopant material. The film formation temperature is selected as necessary.

Thereafter, the resulting zinc oxide based transparent electrically conductive film is heat-treated (or fired), as necessary.

The sputtering apparatus used for film formation of the zinc oxide based transparent electrically conductive film is not specifically limited and is selected as necessary. As for this sputtering apparatus, specifically, for example, direct current (dc) sputtering apparatuses (dc magnetron sputtering apparatuses and the like) and radio-frequency (rf) sputtering apparatuses (rf magnetron sputtering apparatuses and the like) can be used.

Example 1

A zinc oxide based transparent electrically conductive film was formed with a dc magnetron sputtering apparatus through the use of a zinc oxide based sputtering target which is produced by using $\gamma$-$Al_2O_3$ having a particle size of 0.5 μm or less as a dopant material.

The dc magnetron sputtering apparatus used is shown in FIG. 1.

As shown in FIG. 1, the dc magnetron sputtering apparatus includes a vacuum container 11. The inside of the vacuum container 11 can be evacuated with an exhaust pump 12 installed at one end of the vacuum container 11. A gate valve 13 to adjust the exhaust conductance is disposed on the upstream side of the exhaust pump 12.

The above-described zinc oxide based sputtering target 14 is disposed in a lower portion in the vacuum container 11. Furthermore, a substrate 15 to conduct film formation is disposed opposing to the zinc oxide based sputtering target 14 in the upper portion in the vacuum container 11.

The zinc oxide based sputtering target 14 is disposed on an electrode 16 serving as a cathode. The electrode 16 is disposed on an electrode holder 17. The electrode holder 17 is installed on an opening 11a disposed in the bottom of the vacuum container 11. An O-ring 18 seals between the electrode holder 17 and the vacuum container 11. Cooling water can be circulated in the inside of the electrode holder 17 with cooling pipes 19 and 20, so as to cool the electrode holder 17.

The electrode holder 17 is connected to a direct current power supply 21, and a direct current power can be applied to the electrode holder 17 by the direct current power supply 21. A shield 22 is disposed in such a way as to cover the electrode holder 17 exposed at between the electrode 16 and the bottom of the vacuum container 11. Exposure of the electrode holder 17 to plasma during film formation can be prevented by this shield 22.

The substrate 15 is disposed on a substrate holder 23. The substrate holder 23 is installed on an opening 11b disposed in the upper surface of the vacuum container 11. An O-ring 24 seals between the electrode holder 23 and the vacuum container 11. The substrate holder 23 is grounded.

A process gas inlet 25 is disposed in the periphery of the zinc oxide based sputtering target 14 in the inside of the vacuum container 11. A gas pipe 26 is connected to the process gas inlet 25. This gas pipe 26 is branched into gas pipes 27 and 28. An Ar gas is fed from one end of the gas pipe 27 and an $O_2$ gas is fed from one end of the gas pipe 28. Flow rate controllers 29 and 30 are installed on the gas pipes 27 and 28, respectively. Consequently, the Ar gas and $O_2$ gas serving as sputtering gases can be introduced into the vacuum container 11 from the process gas inlet 25 through these gas pipes 26 to 28.

A zinc oxide based transparent electrically conductive film was formed on the substrate 15 through the use of the zinc oxide based sputtering target 14 with the above-described dc magnetron sputtering apparatus. The film formation condition was as described below.

Substrate temperature: room temperature
Ultimate degree of vacuum: $2 \times 10^{-4}$ Pa or less
Sputtering gas: Ar
Sputtering gas pressure: 0.4 Pa
dc Power: 450 W
Film thickness: 120 nm
Substrate 15: non-alkali glass substrate (Corning #1737)

Figure 2:
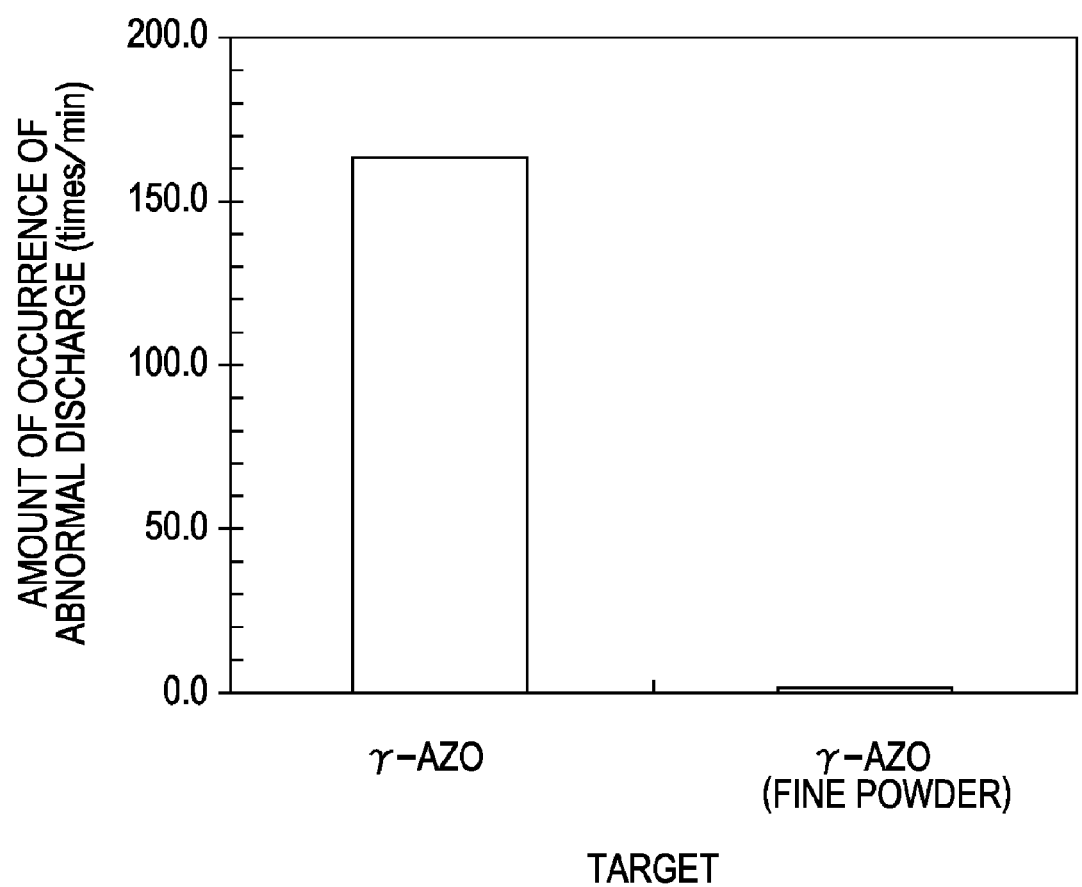
FIG. 2 is a schematic diagram showing measurement results of the amounts of occurrence of abnormal discharge in film formation of zinc oxide based transparent electrically conductive films by a sputtering method in which two types of zinc oxide based sputtering targets are used.

The measurement result of the amount of occurrence of abnormal discharge (times/min) of the zinc oxide based sputtering target 14 in film formation of a zinc oxide based transparent electrically conductive film is shown in FIG. 2. For the purpose of comparison, the result of the same measurement in the case where film formation of a zinc oxide based transparent electrically conductive film was conducted through the use of the zinc oxide based sputtering target, which was produced by using γ-$Al_2O_3$ having the standard particle size (2.2 μl) as the dopant material, is also shown in FIG. 2.

As shown in FIG. 2, the amount of occurrence of abnormal discharge was 162.8 (times/min) in the case where the zinc oxide based sputtering target produced by using γ-$Al_2O_3$ having the standard particle size (2.2 μl) as the dopant material was used, whereas the amount of occurrence of abnormal discharge was reduced significantly to 0.6 (times/min) in the case where the zinc oxide based sputtering target 14 produced by using γ-$Al_2O_3$ having a particle size of 0.5 μm or less as the dopant material was used. This is because regarding the zinc oxide based sputtering target 14 produced by using γ-$Al_2O_3$ having a particle size of 0.5 μm or less as the dopant material, the density is sufficiently high and the resistivity is sufficiently low, as described above.

Figure 3:
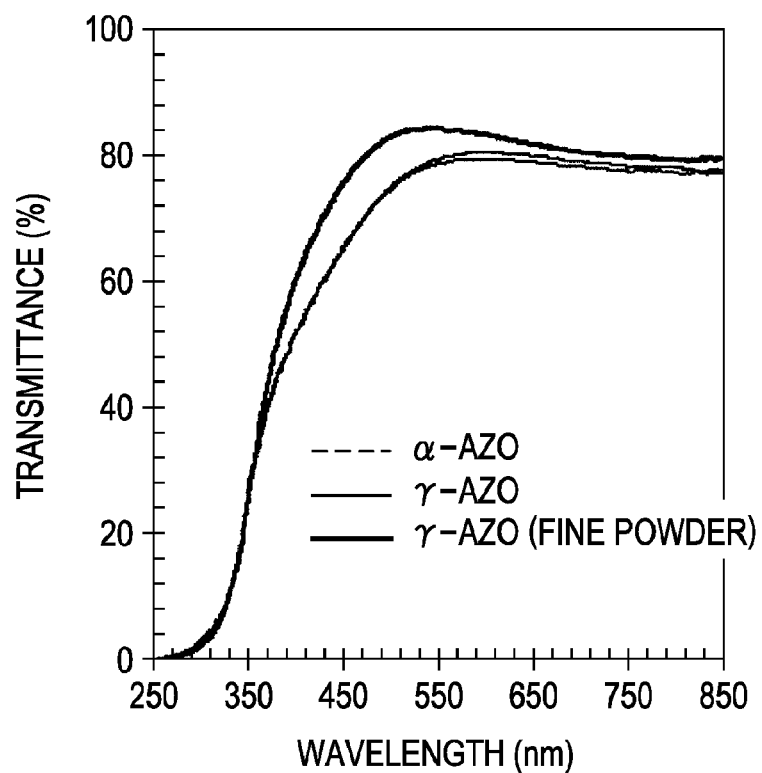
FIG. 3 is a schematic diagram showing measurement results of the transmission characteristics of zinc oxide based transparent electrically conductive films formed in Example 3.
Figure 4:
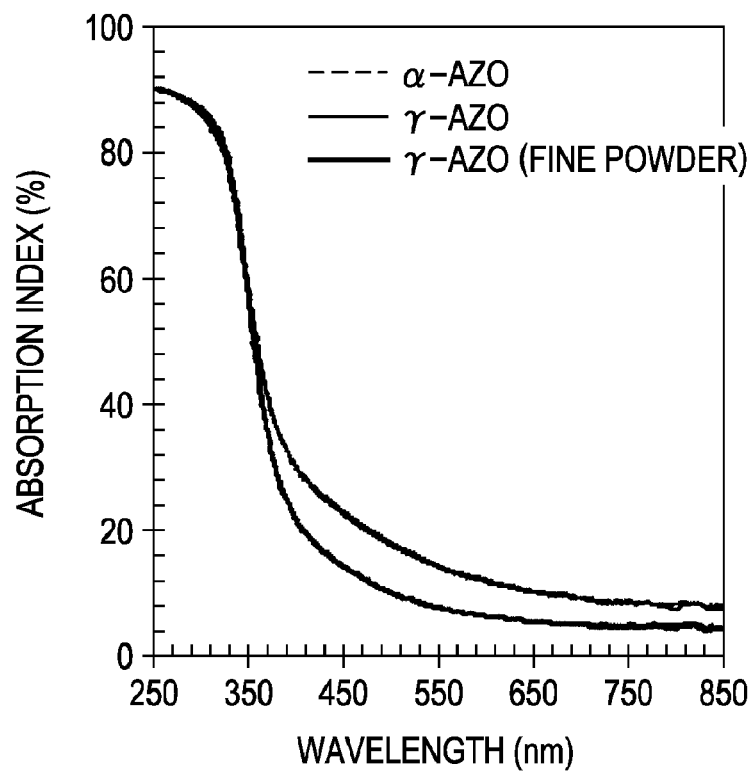
FIG. 4 is a schematic diagram showing measurement results of the absorption characteristics of zinc oxide based transparent electrically conductive films formed in Example 3.

FIG. 3 and FIG. 4 show measurement results of the optical characteristics immediately after film formation of the zinc oxide based transparent electrically conductive films, where the film formation was conducted through the use of the zinc oxide based sputtering target (α-AZO) in the related art, which was produced by using α-$Al_2O_3$ having the standard particle size (2.2 μl) as the dopant material, the zinc oxide based sputtering target (γ-AZO), which was produced by using γ-$Al_2O_3$ having the standard particle size (2.2 μm) as the dopant material, and the zinc oxide based sputtering target (γ-AZO (fine powder)), which was produced by using γ-$Al_2O_3$ having a particle size of 0.5 μm or less as the dopant material. Here, FIG. 3 and FIG. 4 show the transmission characteristics and the absorption characteristics, respectively, of the zinc oxide based transparent electrically conductive films.

Table 3 shows the transmittances and the absorption indices on the visible light average of the zinc oxide based transparent electrically conductive films determined from the measurement results shown in FIG. 3 and FIG. 4 and the transmittances at a wavelength of 460 nm.

TABLE 3

| Target | Visible light average | | Transmittance (@ 460 nm) |
| --- | --- | --- | --- |
| | Transmittance | Absorption index | |
| α-AZO | 74.1 | 17.9 | 68.2 |
| γ-AZO | 74.5 | 17.3 | 72.9 |
| γ-AZO (fine powder) | 79.3 | 11.2 | 78.8 |

As is clear from FIG. 3, the transmittance on the visible light average of the zinc oxide based transparent electrically conductive film formed through the use of the zinc oxide based sputtering target (α-AZO) in the related art, which was produced by using α-$Al_2O_3$ having the standard particle size (2.2 μm) as the dopant material was a low 74.1%. On the other hand, the transmittance on the visible light average of the zinc oxide based transparent electrically conductive film formed through the use of the zinc oxide based sputtering target (γ-AZO), which was produced by using γ-$Al_2O_3$ having the standard particle size (2.2 μl) as the dopant material was a high 74.5%. Furthermore, the transmittance on the visible light average of the zinc oxide based transparent electrically conductive film formed through the use of the zinc oxide based sputtering target (γ-AZO (fine powder)) which was produced by using γ-$Al_2O_3$ having a particle size of 0.5 μm or less as the dopant material was 79.3% and, therefore, was a very high.

Table 4 shows the measurement results of the resistance values (sheet resistance) of the zinc oxide based transparent electrically conductive films after the zinc oxide based transparent electrically conductive films were formed through the use of the above-described three types of zinc oxide based sputtering targets and a heat treatment (pretreatment) was conducted in the air at 120° C. for 1 hour and the values after an environmental resistance test at 90° C. for 100 hours was further conducted.

TABLE 4

| Target | Sheet resistance (Ω/□) | |
|---|---|---|
| | After pretreatment (120° C., 1 hour) | After environmental resistance test (90° C., 100 hours) |
| α-AZO | 132 | 130 |
| γ-AZO | 131 | 124 |
| γ-AZO (fine powder) | 124 | 120 |

As is clear from Table 4, regarding all the zinc oxide based transparent electrically conductive films formed through the use of the above-described three types of zinc oxide based sputtering targets, changes in resistance values between before and after the environmental resistance test are very small by conducting the heat treatment (pretreatment) at 120° C. for 1 hour after the film formation. The pretreatment at a low temperature of 120° C. can be applied to not only the case where a glass substrate is used as the substrate 15, but also the case where a plastic substrate is used. Therefore, the universality is exhibited.

Table 5 shows the results of an alkali resistance test of the zinc oxide based transparent electrically conductive film formed through the use of the zinc oxide based sputtering target (γ-AZO (fine powder)) which was produced by using γ-$Al_2O_3$ having a particle size of 0.5 μm or less as the above-described dopant material. The test was conducted with respect to the zinc oxide based transparent electrically conductive film immediately after film formation and the zinc oxide based transparent electrically conductive film subjected to a heat treatment (or firing) in the air at 200° C. for 1 hour after the film formation. The alkali resistance test was conducted by immersing a sample in a 4% KOH aqueous solution. The immersion time was specified to be 1 minute, 2 minutes, or 5 minutes.

TABLE 5

| | Change (%) in resistance after immersion in KOH (4%) | | |
|---|---|---|---|
| | 1 minute | 2 minutes | 5 minutes |
| Immediately after film formation | +2.1 | +3 | +7.1 |
| Firing in air at 200° C. for 1 hour | 0 | +0.6 | +1.7 |

As is clear from Table 5, the resistance value of the zinc oxide based transparent electrically conductive film immediately after the film formation tends to increase as the immersion time in the 4% KOH aqueous solution increases, whereas the resistance value of the zinc oxide based transparent electrically conductive film subjected to firing in the air at 200° C. for 1 hour is reduced to a low 1.7% even the immersion time in the 4% KOH aqueous solution is 5 minutes. Consequently, it is clear that conduction of the above-described heat treatment after the film formation is preferable to improve the alkali resistance of the zinc oxide based transparent electrically conductive film.

As described above, according to the third embodiment, the zinc oxide based transparent electrically conductive film is formed through the use of the high density, low resistivity zinc oxide based sputtering target which was produced by using γ-$Al_2O_3$ having a particle size of 0.5 μm or less as the dopant material. Consequently, a good-quality zinc oxide based transparent electrically conductive film exhibiting low resistance and excellent transparency can be produced while the amount of occurrence of abnormal discharge in film formation is reduced. In addition, the zinc oxide based transparent electrically conductive film can be formed with high productivity at a low cost.

Furthermore, changes in resistance value of the zinc oxide based transparent electrically conductive film with time can be reduced by conducting a heat treatment at 120° C. after film formation of the zinc oxide based transparent electrically conductive film. Moreover, the alkali resistance of the zinc oxide based transparent electrically conductive film can be improved by conducting a heat treatment at 200° C. for 1 hour after film formation of the zinc oxide based transparent electrically conductive film.

Up to this point, the embodiments according to the present invention have been described specifically. However, the present invention is not limited to the above-described embodiments, and various modifications can be made on the basis of the technical idea of the present invention.

For example, numerical values, structures, configurations, shapes, materials, and the like mentioned in the above-described embodiments are no more than examples, and numerical values, structures, configurations, shapes, materials, and the like different therefrom may be employed, as necessary.

The present application contains subject matter related to that disclosed in Japanese Priority Patent Application JP 2008-296414 filed in the Japan Patent Office on Nov. 20, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for forming a sputtering target, comprising:
   mixing a zinc oxide power and a γ-$Al_2O_3$ powder as a dopant material to produce a mixed powder; and
   filling the mixed powder into a mold in a hot press machine, the mixed powder pressure-molded in an inert gas atmosphere and sintered, thereby producing a zinc oxide based sputtering target, the zinc oxide powder and the γ-$Al_2O_3$ powder being mixed and sintered at a temperature between about 1,150° C. to about 1,250° C.

2. The method as recited in claim 1, wherein the mixed powder comprises about 1 to 3 percent by weight of the γ-$Al_2O_3$ powder.

3. The method as recited in claim 1, wherein the γ-$Al_2O_3$ powder has a particle size that is specified to be about 0.5 μm or less.

4. The method as recited in claim 1, wherein the zinc oxide powder and the γ-$Al_2O_3$ powder are mixed and sintered at a temperature between about 1,150° C. and 1,300° C.

5. The method as recited in claim 1, wherein the γ-$Al_2O_3$ powder has a particle size that is specified to be between about 0.3 μm and 0.5 μm.

6. A method for forming a sputtering target, comprising:
   pulverizing a γ-$Al_2O_3$ powder having a selected particle size with zirconia beads;
   mixing a zinc oxide power and the γ-$Al_2O_3$ powder as a dopant material to produce a mixed powder, the zinc oxide powder and the γ-$Al_2O_3$ powder being mixed and sintered at a temperature between about 1,150° C. to about 1,250° C.; and filling the mixed powder into a mold in a hot press machine, the mixed powder pressure-molded in an inert gas atmosphere and sintered, thereby producing a zinc oxide based sputtering target.

7. The method as recited in claim 6, wherein the mixed powder comprises about 1 to 3 percent by weight of the γ-$Al_2O_3$ powder.

8. The method as recited in claim 6, at the mixing step, wherein the γ-$Al_2O_3$ powder has a particle size that is specified to be between about 0.3 μm and 0.5 μm.

9. The method as recited in claim 6, wherein the standard particle size is about 2.2 μm.

10. The method as recited in claim 6, at the pulverizing step, wherein the γ-$Al_2O_3$ powder having the selected particle size and zirconia beads producing a particle size of 0.5 μm or less.

11. The method as recited in claim 6, at the mixing step, wherein the γ-$Al_2O_3$ powder comprises a particle size that is specified to be about 0.5 μm or less.

12. A method for forming a conductive film, comprising:
pulverizing a γ-$Al_2O_3$ powder having a selected particle size with zirconia beads;
mixing a zinc oxide power and the γ-$Al_2O_3$ powder as a dopant material to produce a mixed powder, the zinc oxide powder and the γ-$Al_2O_3$ powder being mixed and sintered at a temperature between about 1,150° C. to about 1,250° C.; and
filling the mixed powder into a mold in a hot press machine, the mixed powder pressure-molded in an inert gas atmosphere and sintered, thereby producing a zinc oxide based transparent electrically conductive target, and subsequently forming an electrically conductive film from the conductive target.

13. The method as recited in claim 12, wherein the zinc oxide based transparent electrically conductive film is formed by using a sputtering apparatus.

14. The method as recited in claim 13, wherein the sputtering apparatus comprises a direct current sputtering apparatus.

15. The method as recited in claim 13, wherein the sputtering apparatus comprises a radio-frequency sputtering apparatus.

16. The method as recited in claim 12, after the filling step, further comprising providing a heat treatment to the zinc oxide based transparent electrically conductive film at a temperature of 120° C. or higher.

17. The method as recited in claim 12, at the mixing step, wherein the γ-$Al_2O_3$ powder comprises a particle size that is specified to be about 0.5 μm or less.

\* \* \* \* \*